United States Patent [19]
Burke et al.

[11] Patent Number: 6,042,929
[45] Date of Patent: Mar. 28, 2000

[54] MULTILAYER METALIZED COMPOSITE ON POLYMER FILM PRODUCT AND PROCESS

[75] Inventors: Thomas F. Burke, Wayland; Merwin F. Hoover, Topsfield, both of Mass.; John H. Bradshaw, Atkinson, N.H.

[73] Assignee: Alchemia, Inc., Mass.

[21] Appl. No.: 09/053,859

[22] Filed: Mar. 26, 1998

[51] Int. Cl.[7] .................................................. G32B 3/00
[52] U.S. Cl. ..................... 428/141; 428/156; 428/164; 428/209; 428/212; 428/421; 428/469; 428/472; 428/473.5; 428/480; 428/698
[58] Field of Search .................................. 428/698, 457, 428/469, 480, 212, 141, 156, 164, 421, 473.5, 209, 472

[56] References Cited

U.S. PATENT DOCUMENTS

| | | | |
|---|---|---|---|
| 4,226,932 | 10/1980 | Ferraris | 428/450 |
| 4,337,279 | 6/1982 | Polak | 427/40 |
| 4,382,101 | 5/1983 | Polak | 427/40 |
| 4,450,201 | 5/1984 | Brill et al. | 428/698 |
| 4,597,828 | 7/1986 | Tadros | 156/643 |
| 4,725,504 | 2/1988 | Knudsen et al. | 428/458 |
| 4,806,395 | 2/1989 | Walsh | 427/444 |
| 4,868,071 | 9/1989 | Walsh et al. | 428/626 |
| 5,137,791 | 8/1992 | Swisher | 428/612 |
| 5,372,848 | 12/1994 | Blackwell et al. | 427/250 |
| 5,413,687 | 5/1995 | Barton et al. | 204/192 |
| 5,589,280 | 12/1996 | Gibbons et al. | 428/480 |
| 5,874,770 | 2/1999 | Saia et al. | 257/536 |

OTHER PUBLICATIONS

Chang, C.; "enhancedCu–Teflon Adhesionoby Pre–Sputtering Prior to theCu Deposition". A. App; Phys. Lett. 51(16) 1236; Oct. 1987). B. Appl. Phys. Lett. 51(2), 13 103; (Jul. 1987).

Westwood, "Sputter Deposition Processes", MRS Bulletin; (Dec. 1988); pp. 46–51.

Ishii, M., et al; "Copper Sputtered Polyimide films and Their Applications", Proceedings of the Printed circuit World Convention VI, San Francisco, CA, May 11–14, 1993.

Weber, A., et al; "Metalization of Polymers Using Plasma–Enhanced Chemical Vapor Deposited Titanium Nitride as Interlayer", J. Electrochem. soc., vol. 144(No. 3), 1131–1135; (Mar. 1997).

Bergstresser, T. R., et al; "Peel Strength of Adhesiveless Polyimide Laminates After Thermal and Chemical Exposure"; Proceedings on Fourth Intl. Conf. on Flex Circuits (Flexcon 97), Sunnyvale, CA, Sep. 22–24 (1997).

*Primary Examiner*—Archene Turner
*Attorney, Agent, or Firm*—Paul J. Cook

[57] ABSTRACT

A composite substrate material useful for fabricating printed circuits is provided comprising a polymeric film having at least one surface modified by plasma etching, a first thin metal nitride layer, a thin second metal nitride layer, and an electrically conductive third metal layer.

41 Claims, No Drawings

MULTILAYER METALIZED COMPOSITE ON POLYMER FILM PRODUCT AND PROCESS

BACKGROUND OF THE INVENTION

1. Field of the Invention

This invention relates to polymer film-metal composites useful for making printed circuits which are resistant to delamination, particularly when exposed to high temperatures and/or humidity.

2. Description of Prior Art

Traditionally, flexible printed circuits have been used in lieu of discrete wiring harnesses to interconnect components in electronic equipment applications where three-dimensional packaging efficiency, reduced weight, and long-term flexural endurance are critical design objectives. In this role, flexible printed circuit designs are essentially planar wiring assemblies with connectors soldered only to their terminations. More recently, however, this familiar role has been expanded to include multilayer rigid-flex and so-called chip-on-flex (COF) assemblies wherein active and passive devices are attached to the body of the circuit by soldering or thermocompression bonding methods, just as they are in rigid printed circuit assemblies. In this new design context, flexible printed circuits are exposed to more rigorous fabrication and assembly requirements, most notably multiple and extended exposures to temperatures in the 180 to 250° C. range.

Currently, most flexible printed circuits are fabricated from laminates produced by adhesively-bonding preformed copper foil to polyimide or polyester film on either a sheet or roll form basis. Despite their widespread use, these conventional laminates have well-known adhesive-related property limitations which make them particularly unsatisfactory for fine line multilayer and COF designs: poor dimensional stability after etching; elevated levels of retained moisture; high z-axis coefficient of thermal expansion (CTE) values; and excessive thickness. Moreover, due to the fact that the standard Institute for Printed Circuits (IPC) test for thermal stress resistance, IPC-TM-650, Method 2.4.9, method F, is still conducted at 150° C., designers utilizing flexible circuits for the first time may be unaware that the bond strength of adhesive-based laminates, typically 8–9 lbs/in. after thermal cycling at 150° C., deteriorates by more than 50% when cycling is conducted at 180° C. (a common laminating temperature for multilayer constructions) and falls to essentially zero at cycling temperatures above 200° C. (the region of reflow soldering and thermocompression bonding).

These limitations have stimulated interest in a new family of flexible circuit substrate materials based on adhesiveless constructions. In one form, polyimide resin is cast onto a web of copper foil and heat-cured to form a flexible, single-sided metal-dielectric composite; this method, however, is not well-suited to the production of double-sided constructions, an important product category. In another form, polyimide film is directly metalized by either chemical deposition methods (U.S. Pat. Nos. 4,806,395, 4,725,504, 4,868,071) or vacuum deposition methods to produce single- or double-sided constructions. Bare copper itself, however, is not directly bonded to the polymeric film substrate in these constructions because it is well-known that, while reasonably high initial peel strength values of 6–7 lbs/in. can be achieved, the copper-polymer interface in directly-bonded constructions fails catastrophically (delaminates) when exposed to elevated temperature. This phenomenon is generally attributed to the propensity of copper to combine with oxygen or water driven from the film core during the heating process to form copper oxide, a structurally weak and non-passivating interface. Double-sided constructions are especially prone to failure by this mechanism because, as it is converted to a vapor phase, moisture retained in the film core has no means of escape other than via the metal-polymer interfaces. It has also been determined in polyimide-based constructions that the cohesive strength of the polymeric film surface is catalytically degraded by the diffusion of copper into the polymer.

Consequently, in conventional practice, metals such as chromium or nickel or their alloys, which form strong, self-passivating oxides and readily bond to copper, have been employed in film-based adhesiveless substrate materials to serve as a barrier to both the transport of oxygen and the diffusion of copper. Compared to directly-deposited copper, suitable thicknesses of these barrier layer metals do improve the interfacial bond strength retained after thermal exposure but, even so, commercially available adhesiveless substrate materials are not entirely satisfactory in this regard either. Virtually all of these materials exhibit substantial—typically 40% or more—loss of initial bond strength even after thermal cycling at 150° C., a fact that is reflected in IPC-FC-241/18, the acceptability standard for materials of this kind. One explanation for this phenomenon may be that these barrier metals form oxides that are stronger than copper oxide, but only in a relative sense. In the case of materials made by sputtering methods, however, a contributing factor may very well be the industry practice of exposing the polymeric film surface to a so-called plasma etching process prior to the deposition of the barrier layer metal. This process, which is typically performed in an argon-oxygen plasma, is generally considered to enhance barrier metal-polymer adhesion by cleaning the film surface to enhance mechanical adhesion and enriching its oxygen content to promote chemical bonding. Although the latter effect may be of some benefit, it is well-known that argon-oxygen plasmas are essentially ablative in nature and, as such, create relatively smooth, as opposed to roughened, microprofiles which do not materially improve mechanical adhesion. In this regard, it has been found by Ishii, M. et al (Proceedings of the Printed Circuit World Convention VI, San Francisco, Calif., May 11–14, 1993) and others (U.S. Pat. Nos. 4,337,279, 4,382,101, 4,597,828, and 5,413,687) that nitrogen-containing plasmas are more effective.

In addition to being limited with respect to retention of bond strength after thermal cycling, commercially available adhesiveless substrate materials employ barrier layer metals that make the use of these materials problematic with respect to the industry's circuit etching and plating practices. Chromium, for example, cannot be removed by any of the acid or alkaline etchants commonly used in printed circuit operations to remove the copper from the spaces between the trace patterns; removal of the chromium barrier layer also presents a waste disposal problem. Nickel or nickel alloy barrier layers represent an improvement of sorts in that they can be removed in one step with commonly-used acid etchants but, when the overlying copper is removed with any of the alkaline or so-called ammoniacal etchants that predominate in current industry practice, a separate etching step to remove the nickel or nickel alloy is required. It has also been observed by Bergstresser, T. R., et al (Proceedings of Fourth Intl. Conference on Flex Circuits [Flexcon 97], Sunnyvale, Calif., Sep. 22–24, 1997) that when thin layers (less than 200 Angstroms) of nickel or nickel alloy barrier metals are exposed to cyanide gold plating solutions, they are preferentially dissolved. This phenomenon, which leads to undercutting of the copper traces and consequent loss of metal-polymer adhesion, is especially problematic in the fabrication of very fine line designs with trace/space geometries less than 4 mils. Titanium is another well-known barrier layer metal which has been used in semiconductor manufacturing processes to enhance the adhesion of copper deposited onto a spun-on layer of liquid polyimide. However, titanium metal has not been used as a barrier layer in adhesiveless flexible circuit substrate constructions because its removal requires a second etching process that involves special chemistry.

As a means of addresssing the etchability issue, it has been proposed in U.S. Pat. No. 5,137,791 to form an adhesiveless polymer film-metal composite without the benefit of a conventional metal barrier layer by first using an oxygen plasma containing multiple metal electrodes to simultaneously treat the film surface and deposit an extremely thin, non-continuous layer of a metal oxide; a thicker second metal layer such as copper is then deposited over the first layer. Although initial peel strength values greater than 6 lbs/in were reported for polyimide film-based constructions of this kind, no thermal cycling data was provided; it has been found that when a composite material made by this process is subjected to thermal cycling, the peel strength of the metal-polymer bond rapidly degrades. U.S. Pat. No. 5,372,848 proposes to provide for single-stage alkaline etchability by the deposition of a copper nitride barrier layer directly onto an untreated polyimide film surface. Although composites made by this process are alkaline-etchable in one step, it has been found that their initially high adhesion values deteriorate significantly when exposed to elevated temperature. It has been proposed by Weber, A. et al (Journal of the Electrochemical Society, Vol. 144, No.3, March 1997) to use chemical vapor deposition methods to deposit onto polymer-coated silicon wafers a thin titanium nitride barrier layer sufficiently conductive to permit direct electroplating of copper. It has been found that thin TiN barrier layers formed by sputtering methods are too resistive to accomplish direct electroplating of copper and that even sputter-deposited copper does not form a strong bond with TiN because of its stoichiometry.

Thus, efforts to improve the initial/retained peel strength values and chemical processing properties of film-based adhesiveless substrate materials have taken many forms but no completely satisfactory result for flexible printed circuit applications has emerged, nor has the prior art taken the specific form of the novel materials system proposed in this invention.

SUMMARY OF THE INVENTION

In accordance with this invention, a first composite comprising an unsupported polymeric film in sheet or roll form, a thin first metal nitride layer, and a thin, preferably electrically-conductive second metal nitride layer is provided. The first composite of this invention is useful in forming the second composite of this invention which comprises the first composite of this invention coated with an electrically conductive metal layer on the second metal nitride layer. The second composite of this invention is uniquely-suited to the fabrication of fine line flexible circuits by reason of having not only high initial peel strength that does not significantly degrade upon exposure to thermal stress but single-stage etchability in alkaline etchants.

In a first step of the process of this invention, one or both surfaces of an unsupported polymeric film substrate are subjected to a plasma etching step, preferably with a gas that is a source of nitrogen ions, such as nitrogen gas, in order to provide a roughened microprofile surface enriched with nitrogen bonding sites while substantially retaining the mechanical properties of the substrate. In a second step, a first metal nitride layer is deposited upon the plasma etched film surfaces by sputtering. Interposed between the polymeric film substrate and a subsequently-applied second metal nitride layer, the first metal nitride layer provides a barrier layer which prevents migration of moisture or oxygen from the polymeric film to the second metal nitride layer and inhibits the diffusion of the second metal nitride layer or subsequently applied layers into the polymeric film. This first metal nitride layer comprises primarily a metal in the form of a metal nitride having a thickness between about 10 and about 200 Angstroms. A second metal nitride layer, preferably an electrically-conductive metal nitride such as copper nitride, is then deposited on the first metal nitride layer to form the first composite of this invention. The metal nitride of the second layer can comprise the same metal or a different metal from that used to form the first metal nitride layer. The second metal nitride layer generally has a thickness of about 25 to 1500 Angstroms and more usually between about 25 and about 500 Angstroms, thereby to form the first composite of this invention. An electrically-conductive metal layer such as copper is then applied by vacuum deposition or electrochemical methods to the overall polymeric film-metal nitride layers to form the second composite of this invention.

The plasma-treated polymeric film, metal nitride layers, and metal layer cooperate to provide a composite having initial peel strength in excess of 8 pounds/inch when measured by test method IPC-TM-650, Method B and more than 90% retention of initial peel strength when measured by modified IPC-TM-650, Method F, using 180° C. as the upper limit. The composite is capable of passing solder float test IPC-TM-650, Method 2.4.13. and is comprised of a multilayer metal nitride-metal structure that can be removed by either acid or alkaline etching chemistries in one step.

The process of this invention is capable of providing a variety of products and is particularly suited to the production of flexible printed circuits. In one aspect of this invention composite substrate materials are provided in which the multilayer metalization is applied to one or both sides of the polymeric film substrate. In another aspect, the process of this invention can be utilized with pre-perforated polymeric film to provide a double-sided construction with metalized through-hole interconnections.

DETAILED DESCRIPTION OF SPECIFIC EMBODIMENTS

In accordance with this invention, a polymeric film-metal composite structure is provided which has a high initial peel strength between the metal and the polymeric film surface that does not significantly deteriorate after repeated high temperature thermal cycling. In the first step of the process of this invention, a plasma, preferably one containing a source of nitrogen ions, with sufficient energy, that is an energy greater than about 20 Joules/cm$^2$ up to about 200 Joules/cm$^2$, to roughen or create the microprofile on the polymeric film surface by reactive ion etching. The pressure utilized in the plasma chamber is less than about 1500 mTorr and more usually between about 1 and about 50 mTorr. The reactive ion plasma etch with nitrogen produces a surface microprofile with protuberances which extend from the film surface, in contrast to the smooth undulations that characterize the microprofile of a polymeric surface etched with a reactive ion plasma containing oxygen. When plasma energies less than about 20 Joules/cm$^2$ are utilized, insufficient surface roughening occurs; on the other hand, when plasma energies above about 200 Joules/cm$^2$ are utilized, mechanical degradation of the film surface occurs. It is believed that the improved peel strength properties of the composites of this invention result from a combination of greater mechanical adhesion afforded by the roughened microprofile of the film surface and chemical bonding of the subsequently-applied metal nitride to nitrogen sites generated on the polymeric film surface. Although a variety of plasma gases may be utilized, the preferred plasma gas is a mixture consisting of a source of nitrogen ions, for example, nitrogen gas, ammonia, or various amines, or mixtures thereof, and an inert gas such as argon, neon, krypton, or xenon. The preferred energy source for the film-etching plasma is a radio frequency (RF) power supply but other lower frequency power sources are also suitable.

In the second step of the process of this invention, a nitrogen-containing plasma is generated in the presence of one or more metal electrodes or targets which, in the plasma, supply metal ions that react with the nitrogen ions in the plasma to form a first metal nitride layer on the polymeric film surface. This first metal nitride layer is formed at a thickness between about 10 and about 200 Angstroms, preferably between about 50 and 100 Angstroms, and serves as both a binding layer and a barrier layer between the polymeric film surface and a subsequently-applied second metal nitride layer. When this first metal nitride layer is applied at these thicknesses, it is optically clear and the flexibility of the film is substantially retained. The metals utilized in the first metal nitride layer are those which can form strong bonds with a subsequently applied electrically-conductive metal nitride layer. Representative suitable metals for forming this first metal nitride layer include aluminum, titanium, chromium, nickel, zirconium, vanadium, iron, silicon, tantalum, tungsten and alloys thereof, preferably titanium, zirconium, chromium, nickel, or vanadium.

The second metal nitride layer applied to the first metal nitride layer is preferably electrically-conductive, but need not be if a third electrically-conductive layer is deposited above it. The metal nitride in this second layer is formed from copper, nickel, chromium, vanadium, or alloys thereof, preferably copper. The second metal nitride layer has a thickness between about 20 Angstroms and about 2000 Angstroms, preferably between about 100 Angstroms and about 1000 Angstroms so that the resultant composite retains the flexibility of the polymeric film substrate. The second metal nitride layer is formed in a gas atmosphere which includes a source of nitrogen diluted with an inert gas; the volume percent of nitrogen typically is between about 5 and about 100 volume percent. When utilizing copper as the metal, it is preferred to utilize an atmosphere containing between about 5 and about 50 volume percent nitrogen in order to produce an electrically-conductive layer of copper nitride. Since the first and second metal nitride layers are quite thin and sequentially deposited in the same plasma gas, it is believed that at the interface between the two layers, an intermediate layer or zone is formed that consists of a mixture or alloy of the two layers.

Plasma treatment of the film surface and plasma deposition of metal-nitrogen compounds onto the film to form the metal nitride layers are effected in a chamber which has been evacuated of undesired gas so that the desired nitrogen-containing gas can be introduced. It is essential to eliminate water from the polymeric film prior to deposition of metal nitride on the film surface, particularly in double-sided constructions. When a polyimide film is utilized, satisfactory drying can be effected at a temperature between about 50° C. and about 400° C. for a time between about 2 hours and about 1 minute respectively.

After the polymeric film has been plasma-etched with the nitrogen-containing plasma and subsequently coated with the first and second metal nitride layers, a third layer comprising a conductive metal can be deposited on the resultant composite by a variety of methods, among them sputtering, evaporation, electroless plating, and electrolytic plating, alone or in combination. This third conductive metal layer has a thickness greater than about 1000 Angstroms so that the resultant composite can be utilized to form printed circuits, shielding materials, and the like. When relatively large current-carrying capacity is required of the printed circuits fabricated from these composites, conductive metal layers having a thickness of at least about 2.5 µm and typically between about 5 µm and about 35 µm are utilized. Metal layers in this thickness range are preferably formed by electroplating and the metal can be copper, nickel, chromium, or vanadium. The composite should have an initial peel strength of at least 6 lbs/in. The composite of this invention which includes the third conductive metal layer is capable of retaining at least about 60%, preferably at least about 70% and most preferably at least about 80% of its initial peel strength after being exposed to three thermal cycles consisting of a 1 hr. dwell at 180° C. and a 1 hr. dwell at room temperature.

The substrates that can be coated in accordance with the present invention are organic polymeric substrates that include synthetic polymers such as polyesters, polyamides, polyimides, polyimide precursors, polyepoxides, polyetherimides, fluoropolymers, and other materials such as polyaramides that are capable of being formed into non-woven web form structures. The substrate also can be perforated in a pattern consistent with a desired electrical circuit that includes electrically conductive paths through the thickness of the substrate. Typically the perforations have a diameter of between about 10 and 50 mils when formed by a punching process, between about 5 and 10 mils when formed by drilling and between about 0.5 and 2 mils when formed with a laser. While the substrates can be relatively rigid or flexible depending on their thickness and modulus, the process is most easily conducted when the substrate is flexible enough to be handled in a continuous roll form process.

Once the metal layer(s) are formed, a printed wiring board can be made by forming a pattern of conductor lines and spaces in the metal on the substrate. The pattern can be formed by a simple "print and etch" process or by a semi-additive "pattern plating" process that is better-suited to the production of fine line circuitry. In a print and etch process, an etch resist pattern is formed on the surface(s) of the third layer of the substrate material of this invention by either screen printing a liquid resist or laminating, exposing, and developing a dry film photoresist; the third layer in this case is relatively thick, typically from 2 µm to 35 µm. The resist-patterned materials are then transported through spray etching machines where the unprotected copper metal is removed to create electrically non-conductive spaces in the pattern. Subsequent removal of the resist protecting the lines produces the desired circuit pattern. In the semi-additive technique, the surface of the third layer(s) of the substrate material of this invention, which is chosen in this case to be relatively thin (typically from 2 µm to 9 µm), is laminated with a plating resist which is then exposed through a photomask and developed to create a positive image of the desired circuit pattern in the exposed copper. Subsequent immersion in an electroplating bath builds up the copper in the exposed areas of the pattern to a thickness typically in the range from 9 µm to 35 µm. When the plating resist is removed, the thin copper is dissolved with a light etching step that reduces consumption of etchant, minimizes the generation of waste, and leaves a pattern of well-defined circuit lines with straight sidewalls.

To evaluate the suitability of the composite substrates of this invention for the chemical processing requirements of flexible circuit fabrication, sample materials produced by the preferred process described above were used to form printed circuit test patterns by different processing techniques. One sample sheet formed of polyimide film, a first titanium nitride layer, a second copper nitride layer and a third layer of copper was imaged with photoresist and etched in a typical peroxide/sulfuric acid etchant to produce a fine line circuit pattern with 5 mil line/space geometry; the resulting circuit traces were cleanly etched in a single pass through the etching bath and displayed no evidence of undercutting. A second sample sheet was likewise imaged with photoresist and etched in a typical ferric chloride acid etchant with the same results. A third sample sheet was imaged with photoresist and etched in a typical ammoniacal cupric chloride etchant; again, the resulting circuit traces were cleanly etched in a single pass through the etching machine and displayed no evidence of undercutting. X-ray fluorescence spectroscopy (XFS) analysis of the exposed film area on each of the three sample sheets detected only a slight trace of titanium, indicating that the titanium nitride was completely removed in the etching process. While applicants do not intend to be bound to the mechanism perceived to be involved, it is believed that the titanium nitride barrier layer alloys with the overlying copper nitride layer and, when exposed to the strong oxidizing agents in the etchants, converts to titanium oxide; both titanium oxide and copper nitride readily dissolve in the etchant chemistries commonly used in printed circuit fabrication work. On the other hand, protected by the resist-covered copper disposed over it in the trace areas, the titanium nitride retains its chemical state which is highly resistant to etchant undercutting. The exposed film also passed the surface resistance test of IPC-TM650, Method 2.5.17, as well as the moisture and insulation resistance test of IPC-TM650, Method 2.6.3.2. These results indicate that any residual ionic contamination on the film surface was too low to be measurable in these test procedures.

Thus, there are several advantages to fabricating printed circuits, particularly those involving very fine line, high density designs, from the composite materials of this invention:

(1) greater assurance that, due to the unusually high retained peel strength values exhibited by these materials, the circuit traces and pads will not delaminate from the underlying polymeric film during high temperature assembly or rework processes, especially those involving multiple exposures to soldering and thermocompression bonding procedures;

(2) no undercutting of copper traces/pads, which improves circuit fabrication/assembly yields and enhances long-term circuit reliability, especially in dynamic flexing applications;

(3) single-stage etching in ammoniacal etchants, which avoids an extra process step involving special chemicals and simplifies waste treatment procedures.

The equipment used for conducting the experiments shown in the following examples was a custom-built combination plasma treater and metal sputtering machine which could accommodate sheets of polymeric film as large as 14"×16". The film sheets are mounted on a steel plate that rides on a chain-driven rail system; an external speed controller is used to vary the time that the sample is exposed to the etching and metal sputter plasma zones in a central vacuum chamber which is maintained at a pressure of about 1–4 mTorr. The machine has three separate vacuum chambers: a sample introduction chamber and a sample exit chamber, both isolated from the central sputtering chamber by pneumatic sliding gate valves.

Samples of the test film are pre-dried in an external oven to dehydrate them, then mounted on the steel plate which is positioned in the sample introduction chamber. When this chamber is pumped down to the same vacuum as the central chamber, the gate valve is opened and the sample plate is transported into the combination plasma treatment and sputter metalization chamber. Upon completion of the metalization protocol, the sample plate is transported into the exit chamber by opening that gate valve and closing it after the plate is fully inside. The gate valve arrangement prevents the main treating chamber, which has a larger volume than the two satellite chambers, from having to be pumped down each time a sample is introduced for processing. The amount of energy applied to the sample in watt-seconds or Joules/$cm^2$ can be controlled by the energy of the plasma and by the sample exposure time in the plasma zones. The central sputtering chamber is equipped to provide multiple metal targets. By sliding the sample back and forth on the rail system, the metal can be applied in one or multiple layers to build up to any desired thickness. Since this sheet machine does not have cooling capability, certain time intervals between passes under the metalization plasma were necessary to avoid excessive heat build-up in the sheets.

In each of the following examples, a composite structure consisting of a thin barrier/bonding layer estimated to be about 100 Angstroms was first deposited on a plasma-etched polymeric film substrate. A second layer estimated to be about 100 Angstroms was then sputtered onto the first layer and a third layer estimated to be about 1000 Angstroms of copper was sputtered onto the second layer. The thicknesses of these layers were estimated by a combination of optical densitometry and electrical resistance measurement. The sputter-metalized sheets were then mounted in stainless steel plating frames for subsequent electrolytic plating of copper up to 35 $\mu$m thickness (1.4 mils or the standard 1 oz/$ft^2$) for adhesion testing by the standard IPC-TM650, Method 2.4.9. German wheel method. Additional tests performed on each sheet included a modified 180° T-pull peel test, a solder float test, thermal cycling at various temperatures, and a humidity exposure test. The results are reported in the following examples.

Sample sheets plated-up to various copper thicknesses were subsequently fabricated into printed circuit patterns by conventional imaging and etching methods using various standard copper etchants such as the acidic etchants of cupric chloride, peroxide/sulfuric acid, persulphate, ferric chloride, etc., and a so-called alkaline etchant which is ammoniacal cupric chloride. The entire metal layer etched off cleanly down to the film with no visual evidence of residual titanium nitride (which is transparent in any event and highly dielectric). Subsequent electron spectroscopy for chemical analysis (ESCA) results of the exposed film area in the developed circuits indicated no significant residual titanium, thus indicating that the titanium nitride alloyed with the copper nitride etches off cleanly in all of the conventional copper etchants. In addition, etching of the test sample patterns produced very clean, fine lines with no evidence of undercutting. Exposure of the composite materials to a variety of solvents per the standard IPC-TM-650, Method 2.3.2 chemical stability test for flexible circuit substrate materials did not affect bond strength.

The following examples illustrate the present invention and are not intended to limit the same.

EXAMPLE 1

To evaluate the effect that different gas mixtures in the plasma etch process might have on adhesion, samples were prepared using the common barrier layer metals which have been reported in the literature to bond well to polyimide films, either supported (for example, coated onto a wafer substrate) or unsupported. Each of the metalized film samples was made by cutting 14"×16" sheets from a commercial roll of 1 mil Kapton brand polyimide film, Type E; the film sheets were then dehydrated in an oven at 180° C. for 16 hrs. Each sheet was next plasma-etched in a 4 mTorr vacuum at about 10–20 J/$cm^2$ for 15 minutes. Four different plasma-etching gas mixtures were evaluated: 100% Ar; 50/50 Ar/$O_2$; 50/50 Ar/$N_2$; 50/25/25 Ar/$O_2$/$N_2$. The metals evaluated were copper, chromium, nickel, titanium, and aluminum. Each barrier metal candidate was sputter-deposited to about 100 Angstroms in 100% Ar, then oversputtered with about 1000 Angstroms of copper in 100% Ar, one side of the film at a time. After both sides of the sample sheet were metalized in this fashion, they were electrolytically plated-up with copper to 35 μm for peel testing. The sheets were then peel-tested by the standard IPC-TM650 Method 2.4.9, 90° German wheel peel test Method B (cut ½" strips) and evaluated for initial peel strength. Separate cut ½" strips were exposed to three consecutive thermal cycles consisting of an oven bake at 180° C. for 1 hour, followed by cooling in ambient air for 1 hour; after thermal cycling, these samples were evaluated for retained 90° peel strength. All peel results set forth below in Table I are the average of at least three peel strips.

The results presented in Table I show that, regardless of the plasma gas mixture used to pre-treat the film surfaces, copper and aluminum are completely ineffective as barrier layers: after thermal cycling exposure, their initially high peel values deteriorate to essentially zero. On the other hand, chromium, nickel, and titanium all exhibit the typical barrier properties cited in numerous literature references. Of the three, titanium averaged the highest retained values in all gas mixtures (63%), followed by chromium (59%), then nickel (54%). Based on the results achieved by each of these metals in the four gas mixture categories, the most effective gas mixtures for plasma etching are 50/50 Ar/$N_2$ and 100% Ar; the other two mixtures are noticeably less effective. The combination of titanium metal with a 50/50 Ar/$N_2$ plasma etch produced the highest retained peel strength and the only value over 6.0.

TABLE I

| Sample No. | Film Treatment Plasma[1] | Barrier Layer[2] 100 Å | 1000 Å | 90° Peel Strength (lbs/in)[4] | | |
|---|---|---|---|---|---|---|
| | | | | Initial | After 3 TC[3] | % Retention |
| 1 | Ar (100%) | Cu | Cu | 4.5 | 0.0 | 0 |
| 2 | Ar (100%) | Cr | Cu | 6.5 | 4.5 | 69 |
| 3 | Ar (100%) | Ni | Cu | 6.3 | 3.7 | 59 |
| 4 | Ar (100%) | Ti | Cu | 6.5 | 4.0 | 62 |
| 5 | Ar (100%) | Al | Cu | 10.5 | 0.0 | 0 |
| 6 | Ar/$O_2$ (50/50) | Cu | Cu | 6.0 | 0.0 | 0 |
| 7 | Ar/$O_2$ (50/50) | Cr | Cu | 8.0 | 4.2 | 53 |
| 8 | Ar/$O_2$ (50/50) | Ni | Cu | 7.5 | 3.5 | 49 |
| 9 | Ar/$O_2$ (50/50) | Ti | Cu | 8.6 | 5.2 | 61 |
| 10 | Ar/$O_2$ (50/50) | Al | Cu | 11.8 | 0.0 | 0 |
| 11 | Ar/$N_2$ (50/50) | Cu | Cu | 6.5 | 1.5 | 23 |
| 12 | Ar/$N_2$ (50/50) | Cr | Cu | 8.5 | 5.3 | 62 |
| 13 | Ar/$N_2$ (50/50) | Ni | Cu | 8.9 | 5.5 | 62 |
| 14 | Ar/$N_2$ (50/50) | Ti | Cu | 8.7 | 6.2 | 71 |
| 15 | Ar/$N_2$ (50/50) | Al | Cu | 10.6 | 0.0 | 0 |
| 16 | Ar/$O_2$/$N_2$ (50/25/25) | Cu | Cu | 6.5 | 0.0 | 0 |
| 17 | Ar/$O_2$/$N_2$ (50/25/25) | Cr | Cu | 9.2 | 4.8 | 52 |
| 18 | Ar/$O_2$/$N_2$ (50/25/25) | Ni | Cu | 7.5 | 3.5 | 47 |
| 19 | Ar/$O_2$/$N_2$ (50/25/25) | Ti | Cu | 8.4 | 4.8 | 57 |
| 20 | Ar/$O_2$/$N_2$ (50/25/25) | Al | Cu | 11.8 | 0.0 | 0 |

[1]All samples above on 1 mil Kapton ® brand polyimide film, Type E.
[2]The barrier layer was applied using 100% Ar plasma with pure Cu, Cr, Ni, Ti and Al metal targets.
[3]TC indicates a 1 hr. thermal cycle exposure to 180° C.
[4]All peel tests are 90° peels on cut 1/2" strips (Method B) of IPC-TM650, Method 2.4.9.

EXAMPLE 2

It has been reported that certain metals are more effective as barrier layers when deposited in an oxide or nitride form. Accordingly, a series of samples was prepared wherein five different barrier layer metals were deposited in the same plasma gas mixture as the pre-treatment. Thus, the barrier layers in the first five samples were oxide compounds of the five metals selected, the second five samples had metal nitride barrier layers, and the last five samples had metal oxy/nitride barrier layers. Since copper, chromium, and nickel do not form stoichiometric nitrides, the amount of nitrogen that is actually co-deposited with them as an interstitial impurity in the metal crystal lattice will vary, but the thickness of the metal nitride deposit (as determined by an optical densitometer) was about 100 Angstroms. Titanium and aluminum do form stoichiometric nitrides, as do zirconium and other metals not evaluated in this Example. To complete the composite structures evaluated in this Example, the gas was then changed over to pure argon and 1000 Angstroms of pure copper was sputter-deposited on the barrier layer. All the sample sheets were subsequently electroplated to 35 μm of copper, exposed to three thermal cycles at 180° C. for 1 hr., then subjected to the same IPC-TM650-Method 2.4.9, 90° German wheel peel test. All peel results set forth below in Table II are the average of at least three peel strips.

This data summary shows that, while oxide-containing compounds of copper are completely ineffective as barrier layers (zero retained peel strength), copper nitride is reasonably effective (58% retention). In contrast, chrome and nickel are not only reasonably effective in the form of oxide-containing compounds, but quite remarkable (90% retention) in nitride form. Aluminum is reasonably effective in oxide form, but not at all in nitride-containing compounds. Titanium is reasonably effective in oxide-containing compounds but also fails completely in the nitride form. Visual observation of Sample 9 indicated complete release of the copper layer from the substrate and XPS analysis confirmed that titanium nitride was still present on the film surface. Similarly, the copper readily peeled off of the AlN layer in Sample 10. These findings reflect the fact that copper metal can adhere to the non-stoichiometric nitrides of Cu, Cr, and Ni, but not to the stoichiometric nitrides of Ti and Al with which it cannot form a metallic alloy.

TABLE II

| Sample No. | Film Treatment Plasma[1] | Barrier Layer 100 Å | 1000 Å | 90° Peel Strength (lbs/in)[4] | | |
|---|---|---|---|---|---|---|
| | | | | Initial | After 3 TC[3] | % Retention |
| 1 | Ar/$O_2$ (50/50) | $Cu_xO_y$ | Cu | 4.5 | 0.0 | 0 |
| 2 | Ar/$O_2$ (50/50) | $Cr_xO_y$ | Cu | 9.5 | 3.1 | 33 |
| 3 | Ar/$O_2$ (50/50) | Ni/O | Cu | 8.2 | 2.5 | 30 |
| 4 | Ar/$O_2$ (50/50) | $TiO_2$ | Cu | 8.3 | 5.0 | 60 |
| 5 | Ar/$O_2$ (50/50) | $Al_2O_3$ | Cu | 8.1 | 4.5 | 55 |
| 6 | Ar/$N_2$ (50/50) | $Cu_xN_y$ | Cu | 7.1 | 4.1 | 58 |
| 7 | Ar/$N_2$ (50/50) | $Cr_xN_y$ | Cu | 10.9 | 9.8 | 90 |
| 8 | Ar/$N_2$ (50/50) | $Ni_xN_y$ | Cu | 10.7 | 9.7 | 91 |
| 9 | Ar/$N_2$ (50/50) | TiN[2] | Cu | 10.4 | 0.0 | 0 |
| 10 | Ar/$N_2$ (50/50) | AlN | Cu | 11.3 | 0.3 | 3 |
| 11 | Ar/$O_2$/$N_2$ (50/25/25) | $CuO_xN_y$ | Cu | 5.0 | 0.0 | 0 |
| 12 | Ar/$O_2$/$N_2$ (50/25/25) | $CrO_xN_y$ | Cu | 8.9 | 4.7 | 53 |
| 13 | Ar/$O_2$/$N_2$ (50/25/25) | $NiO_xN_y$ | Cu | 8.1 | 3.8 | 47 |
| 14 | Ar/$O_2$/$N_2$ (50/25/25) | $TiO_xN_y$ | Cu | 9.4 | 4.5 | 48 |
| 15 | Ar/$O_2$/$N_2$ (50/25/25) | $AlO_xN_y$ | Cu | 10.0 | 1.2 | 12 |

[1]All samples above on 1 mil Kapton ® brand polyimide film, Type E.
[2]After 3 thermal cycles the copper layer released from the TiN layer with 0 peel strength
[3]TC indicates a 1 hr. thermal cycle exposure to 180° C.
[4]All peel tests are 90° peels on cut 1/2" strips (Method B) of IPC-TM650, Method 2.4.9.

EXAMPLE 3

It was believed that the failure of copper to bond to stoichiometric barrier layer compounds could be prevented by inserting a layer of the same metal used to form the barrier layer compound so that the inserted metal layer would bond to its barrier layer compound below and a copper metal layer above. Thus, the samples evaluated in this Example were prepared by using three different gas mixtures for the plasma pre-treatment. Within each gas mixture group, five different metals were used to form 100 Angstorm thick barrier layer compounds which were then over-sputtered with 100 Angstorm of the same metal in a 100% Ar plasma; 1000 Angstrom of copper was then sputtered onto the intermediate metal layer in a 100% Ar plasma. As in the foregoing examples, all the sample sheets were subsequently electroplated to 35 μm of copper, exposed to three thermal cycles at 180° C. for 1 hr., then subjected to the IPC-TM650-Method 2.4.9, 90° German wheel peel test. All peel results set forth below in Table III are the average of at least three peel strips.

With respect to the metal oxide barrier layer compounds, this tri-layer approach noticeably improved the retained peel strength results for chromium, nickel, and titanium, but had no effect on the prior results for copper and aluminum (complete failure). Essentially, no improvement was found in the results achieved by the oxy-nitride barrier layer compounds. For the nitride barrier layer compounds, none of the previous results were noticeably improved except for titanium, which was transformed from complete failure to the highest percent retention recorded, 93%. Unfortunately, this remarkable result does not translate into a commercially successful flexible circuit substrate material because titanium metal can only be removed with special chemistries not routinely available in printed circuit fabrication shops. Likewise, the results achieved with the chromium and nickel interlayers are also not preferred in that when the overlying copper is removed with conventional alkaline etchants, a second etching operation with chemistry specific to these metals is required. An interesting aspect of the AlN sample (#10) was that the peeled strips after thermal exposure showed no evidence of the 100 Angstrom aluminum metal interlayer, apparently because the thin aluminum diffused into the copper and lost its bond integrity. When the thickness of the aluminum metal interlayer was increased to 500 Angstroms, good bond retention after thermal cycling was achieved but this result does not translate into a commercially satisfactory flexible circuit substrate material because circuit traces subsequently made from this construction were severely undercut by the etchant.

EXAMPLE 4

Based on the superior results achieved in Examples 2 and 3 with nitrogen-based processes, an evaluation was made of a new tri-layer system based on a polyimide film substrate plasma-etched in a 50/50 Ar/$N_2$ gas mixture at about 20 J/$cm^2$. In this case, the tri-layer construction consisted of a wider variety of metal nitride barrier layers 100 Angstroms thick, followed by a copper nitride interlayer 100 Angstrom thick, both sputter-deposited in a 50/50 Ar/$N_2$ plasma, a third layer of pure copper metal 1000 Angstroms thick was deposited in a 100% Ar plasma.

As in the foregoing examples, all the sample sheets were subsequently electroplated to 35 μm of copper, exposed to three thermal cycles at 180° C. for 1 hr., then subjected to the IPC-TM650-Method 2.4.9, 90° German wheel peel test. All peel results set forth below in Table IV are the average of at least three peel strips. Visual examination of both the initial and post-thermal cycling peel strips indicated that adhesion failure was due to cohesive fracture in the top layer of polymer film substrate. This was subsequently confirmed by an XPS analysis of both the film surface and the back of the copper that was peeled off which showed very slight traces of metal left on the film and a significant amount of carbon and nitrogen present on the back of the copper.

The excellent results achieved with respect to both initial peel values and percent bond retention after three thermal cycles demonstrate the effectiveness of this composition for virtually every metal selected, but particularly the first five. As barrier layer candidates, one advantage of both Ti and Zr is that their nitrides are stoichiometric and thereby probably more stable in terms of long-term use than the non-stoichiometric nitrides of chromium, vanadium, and nickel. TiN and ZrN are also optically transparent in 100 Angstrom thickness whereas CrN, VN, and NiN have a dark appearance in this thickness and are more difficult to remove with the overlying copper in a single step using alkaline etching chemistries.

TABLE III

| Sample No. | Film Treatment Plasma[1] | Barrier Layer 100 Å | 100 Å | 1000 Å | 90° Peel Strength (lbs/in)[2] | | |
|---|---|---|---|---|---|---|---|
| | | | | | Initial | After 3 TC[3] | % Retention |
| 1 | Ar/$O_2$ (50/50) | $Cu_xO_y$ | Cu | Cu | 7.7 | 0.0 | 0 |
| 2 | Ar/$O_2$ (50/50) | $Cr_xO_y$ | Cr | Cu | 10.5 | 5.5 | 52 |
| 3 | Ar/$O_2$ (50/50) | NiO | Ni | Cu | 8.3 | 4.7 | 57 |
| 4 | Ar/$O_2$ (50/50) | $Ti_2$ | Ti | Cu | 8.9 | 6.1 | 69 |
| 5 | Ar/$O_2$ (50/50) | $Al_2O_3$ | Al | Cu | 11.4 | 0.0 | 0 |
| 6 | Ar/$N_2$ (50/50) | $Cu_xN_y$ | Cu | Cu | 7.0 | 4.2 | 60 |
| 7 | Ar/$N_2$ (50/50) | $Cr_xN_y$ | Cr | Cu | 9.2 | 8.5 | 92 |
| 8 | Ar/$N_2$ (50/50) | $Ni_xN_y$ | Ni | Cu | 10.0 | 9.1 | 91 |
| 9 | Ar/$N_2$ (50/50) | TiN | Ti | Cu | 10.4 | 9.8 | 93 |
| 10 | Ar/$N_2$ (50/50) | AlN | Al | Cu | 9.5 | 0.8 | 8 |
| 11 | Ar/$O_2$/$N_2$ (50/25/25) | $CuO_xN_y$ | Cu | Cu | 6.2 | 0.0 | 0 |
| 12 | Ar/$O_2$/$N_2$ (50/25/25) | $CrO_xN_y$ | Cr | Cu | 9.0 | 4.9 | 54 |
| 13 | Ar/$O_2$/$N_2$ (50/25/25) | $NiO_xN_y$ | Ni | Cu | 7.9 | 3.7 | 47 |
| 14 | Ar/$O_2$/$N_2$ (50/25/25) | $TiO_xN_y$ | Ti | Cu | 8.3 | 4.8 | 58 |
| 15 | Ar/$O_2$/$N_2$ (50/25/25) | $AlO_xN_y$ | Al | Cu | 10.1 | 0.0 | 0 |

[1]All samples above on 1 mil Kapton ® brand polyimide film, Type E.
[2]All peel tests are 90° peels on cut 1/2" strips (Method B) of IPC-TM650, Method 2.4.9.
[3]TC indicates a 1 hr. thermal cycle exposure to 180° C.

TABLE IV

| Sample No. | Film Treatment Plasma[1] | Barrier Layer 100 Å | 100 Å | 1000 Å | 90° Peel Strength (lbs/in)[2] | | % Retention |
|---|---|---|---|---|---|---|---|
| | | | | | Initial | After 3 TC[3] | |
| 1 | Ar/N$_2$ (50/50)[1] | TiN | Cu$_x$N$_y$ | Cu | 9.2 | 9.0 | 98 |
| 2 | Ar/N$_2$ (50/50) | ZrN | Cu$_x$N$_y$ | Cu | 8.8 | 8.1 | 95 |
| 3 | Ar/N$_2$ (50/50) | Cr$_x$N$_y$ | Cu$_x$N$_y$ | Cu | 9.4 | 8.7 | 93 |
| 4 | Ar/N$_2$ (50/50) | VN | Cu$_x$N$_y$ | Cu | 8.9 | 8.0 | 90 |
| 5 | Ar/N$_2$ (50/50) | Ni$_x$N$_y$ | Cu$_x$N$_y$ | Cu | 10.0 | 8.5 | 85 |
| 6 | Ar/N$_2$ (50/50) | WN | Cu$_x$N$_y$ | Cu | 10.2 | 8.2 | 80 |
| 7 | Ar/N$_2$ (50/50) | FeN | Cu$_x$N$_y$ | Cu | 9.1 | 7.0 | 77 |
| 8 | Ar/N$_2$ (50/50) | FeSiN | Cu$_x$N$_y$ | Cu | 11.4 | 7.0 | 62 |
| 9 | Ar/N$_2$ (50/50)[4] | Cu$_x$N$_y$ | Cu$_x$N$_y$ | Cu | 7.1 | 4.1 | 58 |
| 10 | Ar/N$_2$ (50/50) | MoN | Cu$_x$N$_y$ | Cu | 7.1 | 3.7 | 52 |
| 11 | Ar/N$_2$ (50/50) | AlN | Cu$_x$N$_y$ | Cu | 10.6 | 4.4 | 42 |
| 12 | Ar/N$_2$ (50/50) | TaN | Cu$_x$N$_y$ | Cu | 8.0 | 3.2 | 40 |

[1]All samples above on 1 mil Kapton ® brand polyimide film, Type E.
[2]All peel tests are 90° peels on cut 1/2" strips (Method B) of IPC-TM650, Method 2.4.9.
[3]TC indicates a 1 hr. thermal cycle exposure to 180° C.
[4]Example from U.S. Pat. No. 5,372,848.

EXAMPLE 5

It has been observed that plasmas of the various noble gases such as helium, neon, krypton and xenon, can produce different results on various polymer substrates due to the effect that the relative sizes of the atoms of these noble gases, and hence their kinetic energies at impact, can have on different atoms in the polymer structure. To evaluate the possibility that bond strength might be influenced by choice of plasma gas mixture, sheets of 1 mil Kapton brand polyimide film, type E, were plasma-etched with various nitrogen-containing gas mixtures at about 20 J/cm$^2$; all of the gas mixtures used were 50/50 proportions, except for two samples which were 100% nitrogen. These samples were then metalized in a three layer construction consisting of a 100 Angstrom thick barrier layer of either nickel or titanium nitride deposited onto the film surface, followed by a 100 Angstrom thick copper nitride layer, followed by a 1000 Angstrom thick pure copper layer; the gas mixtures for the first two layers were the same as those used for the pre-treatment of each sample, but the copper layer was sputtered in 100% argon. As in the foregoing examples, all the sample sheets were subsequently electroplated to 35 μm of copper, exposed to three thermal cycles at 180° C. for 1 hr., then subjected to the IPC-TM650-Method 2.4.9, 90° German wheel peel test. All peel results set forth below in Table V are the average of at least three peel strips.

Based on the results presented in Table V, it appears that, at comparable energy levels on this particular polymer substrate, the gases evaluated yield comparable results. Since it is well-known that ammonia readily degrades in a plasma to hydrogen and active nitrogen species, it is not surprising that the 50/50 argon/ammonia gas mixture in Sample 4 produced essentially the same result as Sample 3, an Ar/N$_2$ mixture. Even a 100% nitrogen plasma (Samples 9 and 10) achieved results comparable to those obtained with neon, helium, and argon, which suggests that a noble gas is not essential. However, with a noble gas present, a plasma can be initiated at lower energy levels; consequently, Ar/N$_2$ is the preferred gas mixture for an energy-efficient source of nitrogen ions.

TABLE V

| Sample No. | Film Treatment[1] Plasma[4] | Barrier Layer 100 Å | 100 Å | 1000 Å | 90° peel Strength (lbs/in)[2] | | % Retention |
|---|---|---|---|---|---|---|---|
| | | | | | Initial | After 3 TC[3] | |
| 1 | Ar/N$_2$ | Ni$_x$N$_y$ | Cu$_x$N$_y$ | Cu | 9.3 | 7.6 | 82 |
| 2 | Ar/N$_2$ | TiN | Cu$_x$N$_y$ | Cu | 10.5 | 8.8 | 84 |
| 3 | Ar/NH$_3$ | TiN | Cu$_x$N$_y$ | Cu | 9.5 | 8.3 | 87 |
| 4 | He/N$_2$ | Ni$_x$N$_y$ | Cu$_x$N$_y$ | Cu | 10.5 | 9.4 | 89 |
| 5 | He/N$_2$ | TiN | Cu$_x$N$_y$ | Cu | 9.8 | 8.1 | 83 |
| 6 | Ne/N$_2$ | Ni$_x$N$_y$ | Cu$_x$N$_y$ | Cu | 8.9 | 8.8 | 99 |
| 7 | Ne/N$_2$ | TiN | Cu$_x$N$_y$ | Cu | 8.8 | 8.4 | 84 |
| 8 | N$_2$ (100%) | Ni$_x$N$_y$ | Cu$_x$N$_y$ | Cu | 8.4 | 6.3 | 75 |
| 9 | N$_2$ (100%) | TiN | Cu$_x$N$_y$ | Cu | 9.2 | 8.4 | 91 |

[1]All samples above on 1 mil Kapton ® brand polyimide film, Type E.
[2]All peel tests are 90° peels on cut 1/2" strips (Method B) of IPC-TM650, Method 2.4.9.
[3]TC indicates a 1 hr. thermal cycle exposure to 180° C.
[4]All plasma gas mixtures for film pretreatment and first two barrier layers were 50/50 mixtures, except for Samples 8 and 9 with 100% N$_2$.

EXAMPLE 6

Although Ar/N$_2$ was determined to be the most effective gas mixture in the foregoing example, an additional experiment was undertaken to determine the adhesion sensitivity of metal-nitride barrier layer adhesion to plasma gas nitrogen content. Accordingly, sheets of 1 mil Kapton brand polyimide film, type E, were plasma-etched at about 20 J/cm$^2$ with gas mixtures containing different ratios of nitrogen to argon. These samples were then metalized in a three layer construction consisting of a 100 Angstrom thick barrier layer of titanium nitride formed in the same plasma gas mixture used for the pre-treatment step, followed by 100 Angstroms of copper nitride formed in the same plasma gas mixture, followed by a 1000 Angstrom thick pure copper layer sputtered in 100% argon. As in the foregoing examples, all the sample sheets were subsequently electroplated to 35 μm of copper, exposed to three thermal cycles at 180° C. for 1 hr., then subjected to the IPC-TM650-Method 2.4.9, 90° German wheel peel test. All peel results set forth below in Table VI are the average of at least three peel strips.

From the results summarized in Table VI, it appears that above about 5% nitrogen content, the effectiveness of Ar/N$_2$ gas mixtures for both the plasma pre-treatment process and the barrier layer sputtering process is relatively insensitive to nitrogen content. Nevertheless, below some minimum amount, probably 5% or less by volume, insufficient nitrogen in the plasma will cause the titanium to deposit on the polymer film surface as free metal, thereby rendering it unsuitable for the applications of interest for this invention.

TABLE VI

| Sample No. | Film Treatment Plasma[1] | Barrier Layer 100 Å | 100 Å | 1000 Å | Initial | After 3 TC[3] | % Retention |
|---|---|---|---|---|---|---|---|
| | | | | | 90° Peel Strength (lbs/in)[2] | | |
| 1 | $N_2$ (100%) | TiN | $Cu_xN_y$ | Cu | 8.9 | 8.1 | 91 |
| 2 | $Ar/N_2$ (50/50) | TiN | $Cu_xN_y$ | Cu | 9.2 | 9.0 | 98 |
| 3 | $Ar/N_2$ (75/25) | TiN | $Cu_xN_y$ | Cu | 8.5 | 8.2 | 97 |
| 4 | $Ar/N_2$ (88/12) | TiN | $Cu_xN_y$ | Cu | 9.5 | 8.4 | 88 |
| 5 | $Ar/N_2$ (94/6) | TiN | $Cu_xN_y$ | Cu | 9.3 | 8.9 | 96 |
| 6 | $Ar/N_2$ (98/2)[4] | TiN[2] | $Cu_xN_y$ | Cu | 7.5 | 5.5 | 73 |

[1]All samples above on 1 mil Kapton ® brand polyimide film, Type E.
[2]All peel tests are 90° peels on cut 1/2" strips (Method B) of IPC-TM650, Method 2.4.9.
[3]TC indicates a 1 hr. thermal cycle exposure to 180° C.
[4]Sample No. 6 made with 2% $N_2$ did not produce TiN deposit on the film and free Ti metal was observed.

EXAMPLE 7

It is well known that plasma energy level can have an important effect on barrier layer adhesion. To investigate this relationship, sheets of 1 mil Kapton brand polyimide film, type E, were plasma-etched in a 50/50 $Ar/N_2$ gas mixture using different energy levels. The energy levels were calculated from the watts of RF energy absorbed by the plasma in the area of the sample and, by varying the time of exposure and the pressure in the vacuum chamber, ranged from 2 to 200 $J/cm^2$. In this example, the samples were metalized in a three layer construction consisting of a 100 Angstrom thick barrier layer of nickel nitride formed in the same plasma gas mixture used for the pre-treatment step, followed by 100 Angstroms of copper nitride formed in the same plasma gas mixture, followed by a 1000 Angstrom thick pure copper layer sputtered in 100% argon. As in the foregoing examples, all the sample sheets were subsequently electroplated to 35 μm of copper, exposed to three thermal cycles at 180° C. for 1 hr., then subjected to the IPC-TM650-Method 2.4.9, 90° German wheel peel test. All peel results set forth below in Table VII are the average of at least three peel strips.

The results presented in Table VII show that, for these polyimide film-based samples, low energy levels produce low levels of initial and retained adhesion. As the plasma energy is increased to the 20–50 $J/cm^2$ range, initial and retained adhesion values improve dramatically. Beyond this energy level, however, both categories of adhesion fall off to the point where, at the 200 $J/cm^2$ level, the strength of the bond at the polymer film-barrier layer interface is at best marginal. Atomic force microscopy (AFM) confirmed that an increasing degree of atomic level roughness in the microprofiles of the plasma-etched films accompanied the increase in the energy levels up to about 50 $J/cm^2$; beyond this point, the microprofile of the film diminished and showed evidence of degradation of the polymer. The effect that plasma energy level has on peel strength is also quite observable when different polyimide film structures are etched: those with a higher modulus and stiffer "backbones" require higher levels of energy than the more flexible, typical polyimides with ether linkages that are more easily cleaved.

TABLE VII

| Sample No. | Exposure Time (Mins.) | Pressure ($\mu$) | Total Energy[4] $J/cm^2$ | 90° Peel Strength (/bs/in)[1,2,5] | | |
|---|---|---|---|---|---|---|
| | | | | Initial | After 3 TC[3] | % Retention |
| 1 | 2 | 4 | 2 | 4.2 | 1.5 | 36 |
| 2 | 15 | 4 | 10 | 6.8 | 4.2 | 62 |
| 3 | 30 | 4 | 20 | 12.1 | 9.0 | 74 |
| 4 | 60 | 4 | 40 | 12.0 | 9.1 | 76 |
| 5 | 1 | 1 | 50 | 9.9 | 8.7 | 88 |
| 6 | 30 | 1 | 100 | 5.0 | 3.5 | 70 |
| 7 | 60 | 1 | 200 | 4.8 | 1.2 | 25 |

[1]All samples above on 1 mil Kapton ® brand polyimide film, Type E.
[2]All peel tests are 90° peels on cut 1/2" strips (Method B) of IPC-TM650, Method 2.4.9.
[3]TC indicates a 1 hr. thermal cycle exposure to 180° C.
[4]Assume total exposed energy is cumulative with time.
[5]All samples above were plasma treated with 50/50 Ar/N2 gas mixture under time and pressure conditions shown and metalized with 100 Å $Ni_xN_y$/100 Å $Cu_xN_y$/1000 Å cu and then electroplated to 35 μm cu thickness for peel testing.

EXAMPLE 8

To examine the effect that barrier layer thickness might have on initial and, more importantly, post-thermal exposure peel strength, five samples were prepared using sheets of 1 mil Kapton Type E polyimide film. All film samples were pre-treated with about 10 $J/cm^2$ of energy in a 50/50 $Ar/N_2$ gas mixture. The samples were then metalized in a three layer construction consisting of an initial 100 Angstrom thick barrier layer of nickel nitride formed in the same plasma gas mixture used for the pre-treatment step, followed by 100 Angstroms of copper nitride formed in the same plasma gas mixture, followed by a 1000 Angstrom thick pure copper layer sputtered in 100% argon. As in the foregoing examples, all the sample sheets were subsequently electroplated plated to 35 μm of copper, exposed to three thermal cycles at 180° C. for 1 hr., then subjected to the IPC-TM650-Method 2.4.9, 90° German wheel peel test. All peel results set forth below in Table VIII are the average of at least three peel strips.

To develop the data presented in Table VIII, the thickness of the nickel nitride barrier layer was varied in steps from 100 Angstroms down to about 6 Angstroms by varying the current to the nickel target. The thicknesses of the barrier layers at each step were measured by an optical densitometer. The results show that nickel nitride provides an effective barrier layer in sputter-deposited coatings as thin as about 50 Angstroms, but below this level its effectiveness as measured by retained peel strength drops off quite significantly. Other tests indicate that thickening the nickel nitride above 100 Angstroms does not materially improve its effectiveness as a barrier layer and beyond about 500 Angstroms deterioration in initial peel values is observed. These tests, therefore, establish that a metallic nitride deposited in a thickness range of 50–100 Angstroms produces a continuous, optically clear coating that performs effectively as a barrier to the migration of oxygen and water to the overlying copper layers and, equally important in polyimide film construction, prevents the diffusion of copper into the film where it may oxidize and catalytically degrade the polymer structure.

TABLE VIII

| Sample No. | Amps Into Ni Target | Thickness (Å) $Ni_xN_y$ | 90° Peel Strength (lbs/in)[1,2] Initial | After 3 TC[3] | % Retention |
|---|---|---|---|---|---|
| 1 | 4.00 | 100 | 11.2 | 9.7 | 87 |
| 2 | 2.00 | 50 | 11.3 | 10.2 | 90 |
| 3 | 1.00 | 25 | 10.9 | 6.4 | 59 |
| 4 | 0.50 | 12 | 9.8 | 3.7 | 38 |
| 5 | 0.25 | 6 | 8.5 | 0.9 | 11 |

[1]All samples above on 1 mil Kapton ® brand polyimide film, Type E.
[2]All peel tests are 90° peels on cut 1/2" strips (Method B) of IPC-TM650, Method 2.4.9.
[3]TC indicates a 1 hr. thermal cycle exposure to 180° C.
[4]Plasma pretreatment gas mixture was 50/50 $Ar/N_2$.
[5]Same plasma gas used to deposit variable thickness of $Ni_xN_y$ then 100 Å $Cu_xN_y$ then 1000 Å cu in just Ar plasma prior to electroplating to 35 μm for peel testing.

EXAMPLE 9

Three samples were independently prepared to reproduce the process of this invention and confirm the findings of the previous examples. All three sheets were made using 2 mil Kapton E grade polyimide film which was plasma pretreated with a 50/50 $Ar/N_2$ plasma followed by the sputter-deposition of 100 Angstroms of titanium nitride in a 94/6 $Ar/N_2$ gas plasma, followed by the sputter-deposition of 100 Angstorms of copper nitride in a 94/6 $Ar/N_2$ gas plasma, followed by the sputter-deposition of 1000 Angstroms of copper in a 100% Ar gas plasma. As in the foregoing examples, all the sample sheets were subsequently electroplated to 35 μm of copper, exposed to three thermal cycles at 180° C. for 1 hr., then subjected to the IPC-TM650 -Method 2.4.9, 90° German wheel peel test. All peel results set forth below in Tables IX-A and IX-B are the average of at least three peel strips.

The test results summarized in Table IX-A show a remarkable degree of reproducibility. This may be explained by the fact that both the initial and retained peel strength values match the cohesive failure values reported in the literature for 2 mil Kapton E grade polyimide film. In other words, because the interfacial bond strength provided by the process of this invention exceeds the cohesive strength of the film itself, these test results are actually measures of film properties, not metalization properties per se. Nevertheless, it is clear from these results that the process of this invention is capable of producing a composite flexible circuit substrate material with interlaminar adhesion properties that have exceptional resistance to thermal stress.

TABLE IX-A

| Sample No.[1,2] | Barrier Layer and Initial Metalization[3] | 90° Peel Strength (lbs/in)[4,5] Initial | After 3 TC | % Retention |
|---|---|---|---|---|
| 1 | 100 Å TiN/100 Å $Cu_x/N_y$ + 1000 Å Cu | 9.2 | 9.0 | 98 |
| 2 |  | 9.3 | 9.2 | 99 |
| 3 |  | 9.2 | 8.8 | 96 |
|  | Average | 9.2 | 9.0 | 98 |

[1]All film samples are 2 mil Kapton ® brand polyimide film, Type E.
[2]Film was pretreated with a 50/50 $Ar/N_2$ gas plasma, 15 min./4 μm (10 $J/cm^2$).
[3]Metalization of initial 100 Å TiN and 100 Å $Cu_xN_y$ barrier layer was in a 94/6 $Ar/N_2$ plasma followed by 1000 Å Cu in 100% Ar plasma.
[4]Above sputter metalized film samples were subsequently electroplated with copper to 35 μm for peel testing.
[5]All peel tests are 90° peel on cut 1/2" strips (Method B) of IPC-TM650, Method 2.4.9 and are averages of 3 strips for each value.

The long-term bond durability of double-sided metalized film composites is especially important in many high temperature printed circuit applications, such as under-the-hood automotive and aerospace. The 200° C. thermal exposure data presented in Table IX-B illustrates the unique and remarkable results obtained with metalized film composites using the multilayer constructions of this invention.

TABLE IX-B

|  | 90° Peel Values (lbs/in)[2] | % Retained |
|---|---|---|
| Initial | 9.2[1] | N/A |
| After Thermal Exposure |  |  |
| 0.5 hr. | 8.9 | 97 |
| 1.0 hr. | 9.0 | 98 |
| 2.0 hr. | 9.2 | 100 |
| 4.0 hr. | 9.0 | 98 |
| 8.0 hr. | 8.9 | 97 |
| 24.0 hr. | 7.6 | 83 |

[1]All test strips are ftom Sample Sheet No. 1 above (see also Notes 1, 2, and 3 above).
[2]See also Notes 4 and 5 above.
[3]Thermal exposures were on cut 1/2" strips in air with convection heated oven at 200° C. for times indicated.

To evaluate the suitability of these composites for the chemical processing requirements of flexible circuit fabrication, each of the above three sheets was used to form printed circuit test patterns by different processing techniques. Sheet No. 1 was imaged, developed, and etched in a typical peroxide/sulfuric acid etchant to produce a fine line circuit pattern with 5 mil trace/space geometry; the resulting circuit traces were cleanly etched and displayed no evidence of undercutting. Sheet No. 2 was likewise imaged, developed and etched in a typical ammoniacal cupric chloride etchant with similar results. Sample No. 3 was likewise imaged and etched in a typical ferric chloride acid etchant with the same excellent results. XPS analysis of the exposed film area on each of the three sheets detected only a slight trace of titanium, indicating that the titanium nitride was completely removed in the etching process. It is believed that the titanium nitride barrier layer alloys with the overlying copper nitride layer and, when exposed to the strong oxidizing agents in the etchants, converts to titanium oxide; both titanium oxide and copper nitride readily dissolve in the etchant chemistries commonly used in printed circuit fabrication work. On the other hand, protected by the resist-covered copper disposed over it in the trace areas, the titanium nitride retains its chemical state which is highly resistant to etchant undercutting. The exposed film also passed the surface resistance test of IPC-TM650, Method 2.5.17, as well as the moisture and insulation resistance test of IPC-TM650, Method 2.6.3.2. These results indicate that any residual ionic contamination on the film surface was too low to be measurable in these test procedures.

EXAMPLE 10

In this example, the application of the metalization process described in this invention to other polymer films typically used to fabricate printed circuits was evaluated. Each sample was prepared with a 50/50 $Ar/N_2$ pre-treatment which was followed by the sputter-deposition of 100 Angstroms of titanium nitride in a 94/6 $Ar/N_2$ gas plasma, followed by the sputter-deposition of 100 Angstroms of copper nitride in a 94/6 $Ar/N_2$ gas plasma, followed by the sputter-deposition of 1000 Angstroms of copper in a 100% Ar gas plasma. As in the foregoing examples, all the sample sheets were subsequently electroplated to 35 μm of copper.

With the exception of Samples 7 (Ultem) and 8 (PEN), all samples were exposed to three thermal cycles at 180° C. for 1 hr., then subjected to the IPC-TM650-Method 2.4.9, 90° German wheel peel test. Samples 7 and 8 could not be subjected to a thermal cycle test at 180° C. because this temperature exceeds the thermal limits of the films; these samples were therefore tested at 150° C., the standard IPC test condition. The results of these tests are presented Table X.

Compared to reference Samples 1 and 2, Samples 3–6, which are based on polyimide films with different chemical formulations, achieved comparable peel test results. However, no meaningful peel values could be obtained on the remaining samples due to internal film fracturing. This is to say that the metal-polymer interface remained intact during the peel test, but the film itself failed cohesively at extremely low force levels (typically less than 2 lbs/in.).

Samples 3–6 were also subjected to a so-called "pressure-cooker" test wherein the material is suspended above boiling water in a pressure cooker to simulate under accelerated conditions the effect of long-term exposure to high humidity conditions. In all cases, the interlaminar integrity of the composite was not affected. Similarly, when subjected to IPC-TM650, Method 2.3.2, Samples 3–6 proved to be highly resistance to degradation by any of the various chemical reagents used in this test method.

TABLE X

| Sample No. | Film Substrate[1] | 90° Peel Strength (lbs/in)[2,4] | | % Retention |
|---|---|---|---|---|
| | | Initial | After 3 TC[3] | |
| 1 | 1 mil polyimide - Kapton V | 9.9 | 7.7 | 78 |
| 2 | 1 mil polyimide - Kapton E | 13.4 | 9.5 | 71 |
| 3 | 2 mil polyimide - Kapton E | 9.2 | 9.0 | 98 |
| 4 | 1 mil polyimide - Apical AV | 9.8 | 7.2 | 74 |
| 5 | 2 ml polyimide - Apical NP | 9.0 | 8.5 | 94 |
| 6 | 2 mil polyimide - Upilexs | 7.7 | 6.2 | 81 |
| 7 | 2 mil polyetherimide - Ultem 1000 | (7) | (7) | — |
| 8 | 2 mil polyethylene Naphthalate (PEN) | (7) | (7) | — |
| 9 | 2 mil polybenzimidazole (PBI)[5] | (7) | (7) | — |
| 10 | 2 mil polyarylene ether-benzimidazole (PAEBI or PABI) | (7) | (7) | — |
| 11 | 3 mil polytetrafluoroethylene (PTFE) | (7) | (7) | — |
| 12 | 2 mil polyester liquid crystal polymer (Vectra)[6] | (7) | (7) | — |
| 13 | 1.5 mil polyaramide-Nomex nonwoven paper | (7) | (7) | — |

[1] All above film samples were subjected to a plasma pretreatment in a 50/50 Ar/N$_2$ gas at 4 μm pressure for 15 mins. (10 J/cm$^2$).
[2] All peel tests are 90° peels on cut 1/2" strips (Method B) of IPC-TM650, Method 2.4.9.
[3] TC indicates a 1 hr. thermal cycle exposure to 180° C.
[4] A barrier layer of 100 Å TiN/100 Å Cu$_x$N$_y$ was applied in same plasma gas and then 1000 Å Cu was deposited in 100% Ar plasma. Subsequently, all samples were electroplated up to 35 μm copper thickness for peel testing.
[5] Samples 9 and 10 are developmental films obtained from NASA/Langley.
[6] Sample 12 was a development film obtained from Foster-Miller.
[7] Samples 7–13: no metal-polymer peel strength values per se were obtained for these constructions because cohesive fracturing occurred in the polymer substrate itself when an attempt was made to peel the metal from the substrate, i.e., the metal-polymer interface was stronger than the cohesive strength of the film itself.

We claim:

1. A composite comprising a polymeric substrate having at least one surface modified by plasma etching to form a micro-roughened substrate surface, a layer on said micro-roughened substrate surface comprising a first metal nitride layer, a second nonstoichiometric metal nitride layer on said first metal nitride layer, said first metal nitride layer and said second nonstoichiometric metal nitride layer capable of being dissolved in an alkaline etchant composition and a third electrically conductive metal layer on said nonstoichoimetric metal nitride layer.

2. The composite of claim 1 wherein said second nonstoichiometric metal nitride layer is electrically conductive.

3. The composite of claim 1 wherein the composite retains at least about 60% of its initial peel strength after being exposed to three thermal cycles consisting of 1 hour at room temperature followed by 1 hour at 180° C.

4. The composite of claim 1 wherein said substrate has perforations through its thickness.

5. The composite of claim 4 wherein the composite retains at least about 60% of its initial peel strength after being exposed to three thermal cycles consisting of 1 hour at room temperature followed by 1 hour at 180° C.

6. The composite of claim 1 wherein said second nonstoichiometric metal nitride layer is a nitride of copper.

7. The composite of claim 6 wherein said metal layer is copper.

8. The composite of claim 1 wherein said metal layer is copper.

9. The composite of any one of claims 1, 2, 4, 3, 5, 6, 8 or 7 wherein said first metal nitride is selected from the group consisting of titanium nitride, zirconium nitride, chromium nitride, nickel nitride, and vanadium nitride.

10. The composite of claim 9 wherein said polymeric substrate is a polyimide film.

11. The composite of claim 9 wherein said polymeric substrate is polyaramid nonwoven paper.

12. The composite of any one of claims 1, 2, 4, 3, 5, 6, 8 or 7 wherein said polymeric substrate is a polyimide film.

13. The composite of claim 12 wherein said first metal nitride is selected from the group consisting of titanium nitride, zirconium nitride, chromium nitride, nickel nitride, and vanadium nitride.

14. The composite of any one of claims 1, 2, 4, 3, 5, 6, 8 or 7 wherein said polymeric substrate is a polyetherimide film.

15. The composite of claim 14 wherein said first metal nitride is selected from the group consisting of titanium nitride, zirconium nitride, chromium nitride, nickel nitride, and vanadium nitride.

16. The composite of any one of claims 1, 2, 4, 3, 5, 6, 8, 7 wherein said polymeric substrate is a polyester film.

17. A composite of claim 16 wherein said first metal nitride is selected from the group consisting of titanium nitride, zirconium nitride, chromium nitride, nickel nitride, and vanadium nitride.

18. The composite of any one of claims 1, 2, 4, 3, 5, 6, 8 or 7 wherein said polymeric substrate is a fluoropolymer film.

19. A composite of claim 18 wherein said first metal nitride is selected from the group consisting of titanium nitride, zirconium nitride, chromium nitride, nickel nitride, and vanadium nitride.

20. The composite of any one of claims 1, 2, 3, 5, 6, 8, or 7 wherein said polymeric substrate is polyaramid nonwoven paper.

21. A composite comprising a polymeric substrate having at least one surface modified with a nitrogen ion-containing plasma to form a micro-roughened substrate surface, a layer on said micro-roughened substrate surface comprising a first metal nitride layer, a second nonstoichiometric metal nitride layer on said first metal nitride layer, said first metal nitride layer and said second nonstoichiometric metal nitride layer capable of being dissolved in an alkaline etchant composition and a third electrically conductive metal layer on said nonstoichoimetric metal nitride layer.

22. The composite of claim 21 wherein said second nonstoichiometric metal nitride layer is a nitride of copper.

23. The composite of claim 21 wherein said substrate has perforations through its thickness.

24. The composite of claim 21 wherein the composite retains at least about 60% of its initial peel strength after being exposed to three thermal cycles consisting of 1 hour at room temperature followed by 1 hour at 180°.

25. The composite of claim 23 wherein the composite retains at least about 60% of its initial peel strength after being exposed to three thermal cycles consisting of 1 hour at room temperature followed by 1 hour at 180° C.

26. The composite of claim 21 wherein said second nonstoichiometric metal nitride layer is a nitride of copper.

27. The composite of claim 26 wherein said metal layer is copper.

28. The composite of claim 21 wherein said metal layer is copper.

29. A composite of claim 28 wherein said first metal nitride is selected from the group consisting of titanium nitride, zirconium nitride, chromium nitride, nickel nitride, and vanadium nitride.

30. The composite of any one of claims 21, 22, 23, 24, 25, 28 or 27 wherein said first metal nitride is selected from the group consisting of titanium nitride, zirconium nitride, chromium nitride, nickel nitride, and vanadium nitride.

31. The composite of claim 30 wherein said polymeric substrate is a polyimide film.

32. The composite of claim 30 wherein said polymeric substrate is polyaramid nonwoven paper.

33. The composite of any one of claims 21, 22, 23, 24, 25, 28 or 27 wherein said polymeric substrate is a polyimide film.

34. The composite of claim 33 wherein said first metal nitride is selected from the group consisting of titanium nitride, zirconium nitride, chromium nitride, nickel nitride, and vanadium nitride.

35. The composite of any one of claims 21, 22, 23, 24, 25, 28 or 27 wherein said polymeric substrate is a polyetherimide film.

36. The composite of claim 35 wherein said first metal nitride is selected from the group consisting of titanium nitride, zirconium nitride, chromium nitride, nickel nitride, and vanadium nitride.

37. The composite of any one of claims 21, 22, 23, 24, 25, 28 or 27 wherein said polymeric substrate is a polyester film.

38. A composite of claim 37 wherein said first metal nitride is selected from the group consisting of titanium nitride, zirconium nitride, chromium nitride, nickel nitride, and vanadium nitride.

39. The composite of any one of claims 21, 22, 23, 24, 25, 28, or 27 wherein said polymeric substrate is a fluoropolymer film.

40. The composite of any one of claims 21, 22, 23, 24, 25, 26, 28, or 27 wherein said polymeric substrate is polyaramid nonwoven paper.

41. The composite of any one of claims 1, 4, 3, 5, 8, 7, 21, 23, 24, 26, 28, or 27 wherein the third electrically conductive metal layer is patterned.

* * * * *